United States Patent
Kim et al.

(10) Patent No.: US 7,554,869 B2
(45) Date of Patent: Jun. 30, 2009

(54) SEMICONDUCTOR MEMORY DEVICE HAVING INTERNAL CIRCUITS RESPONSIVE TO TEMPERATURE DATA AND METHOD THEREOF

(75) Inventors: Soo-Young Kim, Seoul (KR); Sang-Jae Rhee, Sungnam-si (KR); Min-Gyu Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/981,652

(22) Filed: Nov. 5, 2004

(65) Prior Publication Data

US 2005/0146965 A1 Jul. 7, 2005

(30) Foreign Application Priority Data

Dec. 23, 2003 (KR) .................. 10-2003-0095107

(51) Int. Cl.
*G11C 7/04* (2006.01)
(52) U.S. Cl. .................. 365/211; 365/212; 365/207
(58) Field of Classification Search .................. 365/211, 365/212, 207; 374/100, 163, 170, 171
See application file for complete search history.

(56) References Cited

U.S. PATENT DOCUMENTS

| | | | |
|---|---|---|---|
| 5,285,418 A | 2/1994 | Yamaguchi | |
| 5,822,267 A | 10/1998 | Watanabe et al. | |
| 6,608,791 B2* | 8/2003 | Watanabe et al. | 365/211 |
| 6,687,165 B1* | 2/2004 | Cioaca | 365/189.05 |
| 6,741,095 B2* | 5/2004 | Abrosimov et al. | 326/30 |
| 6,967,877 B2* | 11/2005 | Chou | 365/211 |
| 7,107,178 B2* | 9/2006 | Won et al. | 702/130 |
| 2005/0074051 A1* | 4/2005 | Won et al. | 374/170 |
| 2005/0105367 A1* | 5/2005 | Kim et al. | 365/226 |

FOREIGN PATENT DOCUMENTS

KR 2001-0004581 1/2001

* cited by examiner

*Primary Examiner*—Huan Hoang
(74) *Attorney, Agent, or Firm*—Harness, Dickey & Pierce, PLC

(57) ABSTRACT

A semiconductor memory device having internal circuits responsive to temperature data, in order to compensate an output characteristic change of the internal circuits and reduce power consumption depending on temperature change, and method thereof are disclosed. The semiconductor memory device may include a temperature sensing circuit and an internal circuit. The temperature sensing circuit may generate and output temperature data in response to ambient temperature of the semiconductor memory device. The internal circuit may adjust an output level of an output signal in response to the temperature data from the temperature sensing circuit.

22 Claims, 14 Drawing Sheets

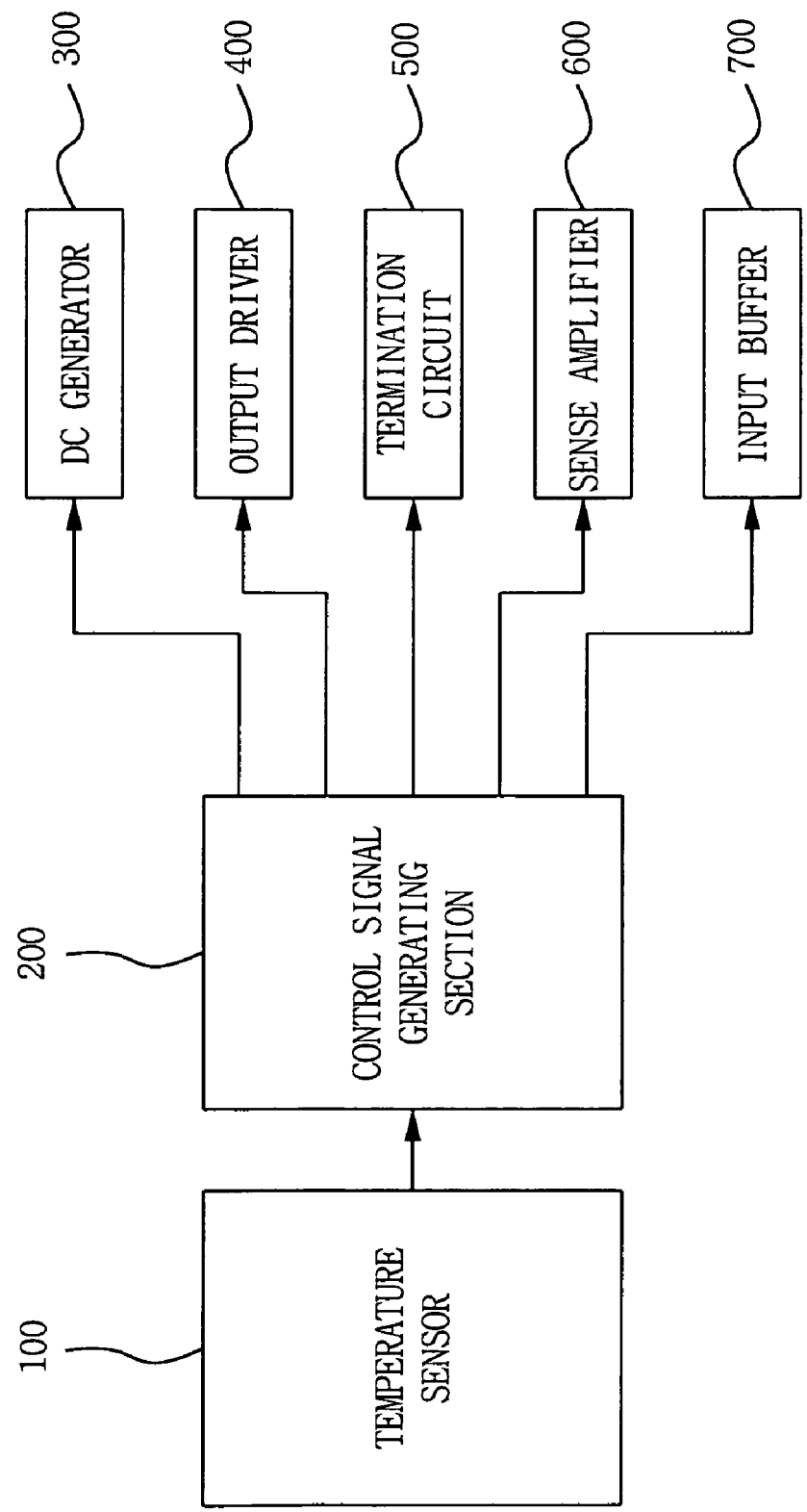

SEMICONDUCTOR MEMORY DEVICE HAVING INTERNAL CIRCUITS RESPONSIVE TO TEMPERATURE DATA AND METHOD THEREOF

CROSS-REFERENCE TO RELATED APPLICATION

This U.S. non-provisional application claims priority under 35 U.S.C. § 119 to Korean Patent Application No. 2003-95107, filed on Dec. 23, 2003, in the Korean Intellectual Property Office, the contents of which are hereby incorporated by reference in their entirety.

BACKGROUND OF THE INVENTION

1. Technical Field

The present invention relates generally to a semiconductor memory device and, more particularly, to a semiconductor memory device having internal circuits responsive to temperature data.

2. Discussion of the Related Art

A variety of semiconductor devices implemented by integrated circuit chips, such as CPUs, memories, gate arrays or the like, may be incorporated in a variety of electrical products, for example, but not limited to, portable personal computers, personal digital assistants (PDAs), servers, workstations or the like. If such electrical products are maintained in a sleep mode to save power, most of circuit components in the electrical product may remain in a turned-off state. Further, some semiconductor devices may continue to use power even in the sleep mode. For example, a volatile semiconductor memory device, such as, but not limited to, a dynamic random access memory (DRAM) may refresh data through memory cells so that the data stored in the memory cells may continue to be reserved, and thus consume power. In other words, the DRAM may consume the self-refresh power due to the required self-refreshing operation. Accordingly, it may be desirable to reduce power consumption in a battery-operated system that requires reduced power.

One attempt to reduce power consumption required for the self-refresh may be to change a refresh period depending on temperature. That is, as the power consumption at a lower temperature may be reduced by lowering a refresh clock frequency as compared to a higher temperature, the time period for which data may be reserved in the DRAM may become generally longer as temperature is reduced.

In the conventional art, an example of controlling power consumption by reducing power consumption upon the refresh operation may be that the refresh operation may be performed at a lower voltage when temperature is less than a desired value, while alternatively the refresh operation may be performed at a higher voltage when the temperature is more than the desired value.

Accordingly, the semiconductor memory device may include a refresh circuit as well as a variety of internal circuits therein.

SUMMARY OF THE INVENTION

Exemplary embodiments of the present invention provide a semiconductor memory device including at least a temperature sensing circuit and an internal circuit. The temperature sensing circuit generates and outputs temperature data in response to ambient temperature of the semiconductor memory device. The internal circuit adjusts an output level of an output signal in response to the temperature data from the temperature sensing circuit.

In an exemplary embodiment, the temperature sensing circuit may be a current mirror type differential amplifier connected to a reduction resistor branch for which a current may be reduced with increase in temperature.

In another exemplary embodiment, the temperature sensing circuit may include a band-gap reference circuit.

In yet another exemplary embodiment, the internal circuit may be a reference voltage generating circuit.

In yet another exemplary embodiment, the internal circuit may be a high voltage generating circuit for generating a high voltage having a level higher than that of an internal power supply voltage of the semiconductor memory device.

In yet another exemplary embodiment, the internal circuit may be a substrate voltage generating circuit for generating a negative voltage having a negative voltage level with respect to a level of an internal power supply voltage of the semiconductor memory device.

In yet another exemplary embodiment, the internal circuit may be a data output driver of the semiconductor memory device.

In yet another exemplary embodiment, the internal circuit may be an on-die termination circuit of the semiconductor memory device.

In yet another exemplary embodiment, the internal circuit may be an input/output sense amplifier circuit connected to input/output lines of the semiconductor memory device.

In yet another exemplary embodiment, the internal circuit may be an input buffer for buffering various input signals applied to the semiconductor memory device.

In another exemplary embodiment, the temperature sensing data may be applied to a gate terminal of a transistor that variably changes output resistance of the internal circuit.

In yet another exemplary embodiment, the temperature sensing data may be applied to a gate terminal of a transistor that variably changes output resistance of the internal circuit.

In yet another exemplary embodiment, the temperature sensing circuit may further include a temperature sensor and a control signal generating unit. The temperature sensor may include a reference voltage generating circuit for generating a reference output voltage, a first temperature sensing section for generating a first sensing output voltage to detect a first set temperature, and a second temperature sensing section for generating a second sensing output voltage to detect a second set temperature. The control signal generating unit may include first and second comparators for comparing the reference output voltage and the first and second sensing output voltages, respectively, so as to produce first and second temperature sensing data.

Another exemplary embodiment of the present invention includes a semiconductor memory device having at least a temperature sensor for detecting ambient temperature of the semiconductor memory device as a voltage signal, a control signal generating unit for comparing the voltage signal outputted from the temperature sensor to a reference signal to generate temperature sensing data, and an internal circuit having a voltage output level, the voltage output level may be adjusted in response to the temperature sensing data from the control signal generating unit.

In another exemplary embodiment, the internal circuit may be an output driver having a driving output level, a termination circuit having termination resistance, a sense amplifier having a sensing output level, and an input buffer having setup and hold times for an input signal, wherein the setup and hold times may be adjusted in response to the temperature sensing data from the control signal generating unit.

Another exemplary embodiment of the present invention may provide a method for controlling an output characteristic in a semiconductor memory device having internal circuits. The method may include generating temperature data that corresponds to ambient temperature of the semiconductor memory device, and allowing output levels of the internal circuits to be adjusted by applying the temperature data to output change terminals of the internal circuits.

In another exemplary embodiment, generating the temperature sensing data may further include generating a reference output voltage for determine a reference voltage, generating a first sensing output voltage to detect a first set temperature, generating a second sensing output voltage to detect a second set temperature, and comparing the reference output voltage and the first and second sensing output voltages to produce the temperature sensing data.

According to exemplary embodiments of the semiconductor memory device of the present invention, there is an advantage which enhances stability of the operation and reduces power consumption when change in output characteristics of internal circuits depending on temperature change is operated.

In the exemplary embodiment, the present invention provides that the power consumption may be reduced or an output characteristic changed depending on temperature data in a battery operated system requiring low power.

In another exemplary embodiment, the present invention provides low power, high integration semiconductor memory devices for controlling operations of the refresh circuit as well as various internal circuits in the chip depending on the sensing temperature.

BRIEF DESCRIPTION OF THE DRAWINGS

Exemplary embodiments of the present invention will be readily understood with reference to the following detailed description thereof provided in conjunction with the attached drawings in which:

FIG. 1 is a block diagram related to a semiconductor memory device according to an exemplary embodiment of the present invention;

DETAILED DESCRIPTION OF EXEMPLARY EMBODIMENTS

Figure 2A:
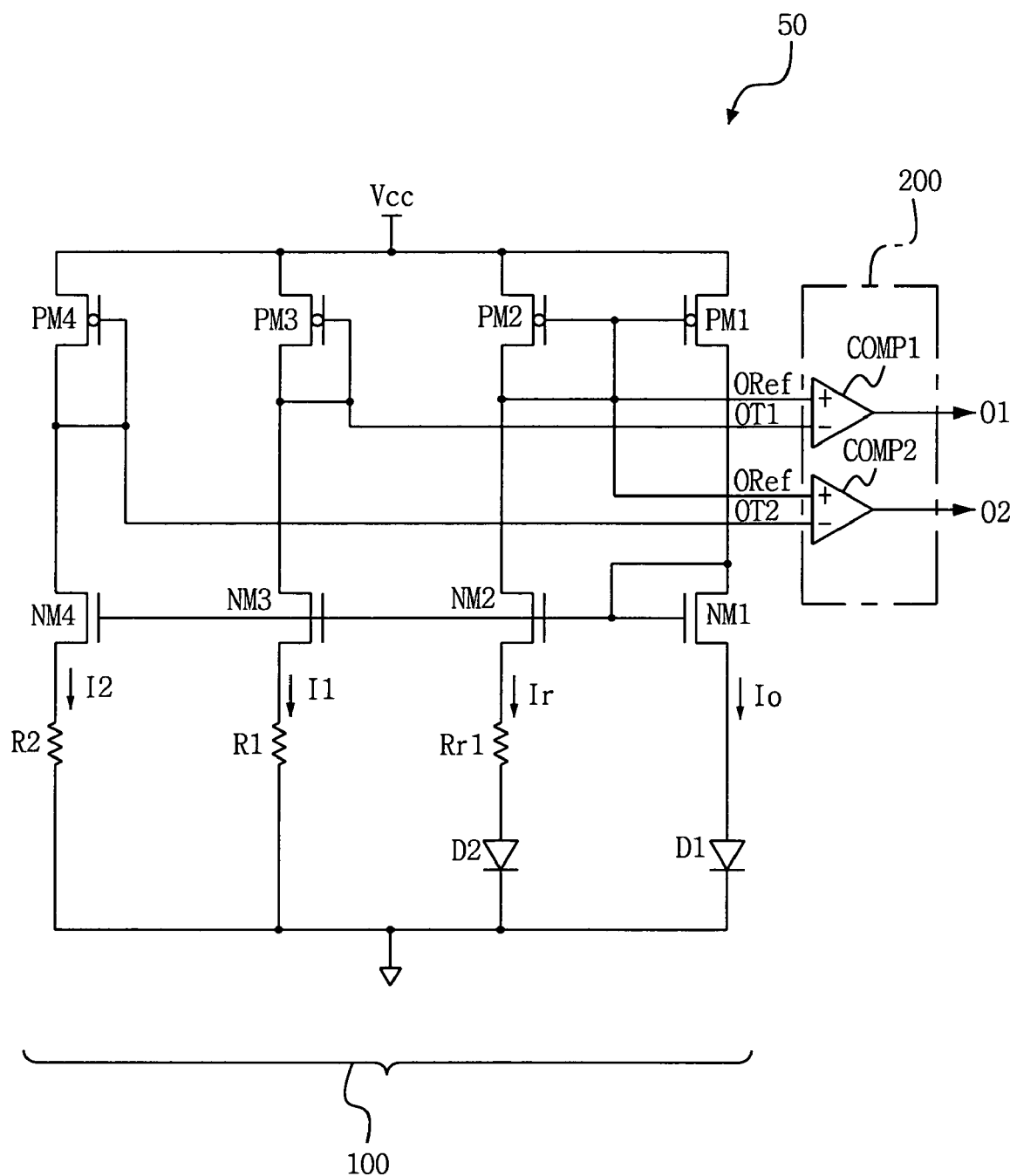
FIGS. 2a and 2b illustrate exemplary embodiments of the temperature sensing circuit in FIG. 1.

Hereinafter, exemplary embodiments of a semiconductor memory device having an internal circuit responsive to temperature sensing data according to the present invention will be described with reference to the accompanying drawings. Components having the same or similar function may be indicated by the same or similar reference numerals even though denoted in different drawings.

FIG. 1 is a block diagram related to a semiconductor memory device according to an exemplary embodiment of the present invention. A temperature sensor 100, a control signal generating section 200, a DC generator 300, an output driver 400, a termination circuit 500, a sense amplifier 600, and an input buffer 700 may be disposed on a chip of the semiconductor memory device. The temperature sensor 100 and the control signal generating section 200 may constitute a temperature sensing circuit 50, which may output, as temperature sensing data, a temperature output generated in response to ambient temperature of the semiconductor memory device.

The temperature sensing data, which may be outputted from the control signal generating section 200, may be selectively applied to at least the DC generator 300, the output driver 400, the termination circuit 500, the sense amplifier 600, or the input buffer 700. That is, the temperature sensing data may be applied only to the output driver 400, if only the output driver 400 may be required to be controlled. However, the temperature sensing data may depend on the temperature of the other internal circuits, such as, for example, the DC generator 300, the output driver 400, the termination circuit 500, the sense amplifier 600, and the input buffer 700.

Figure 2B:
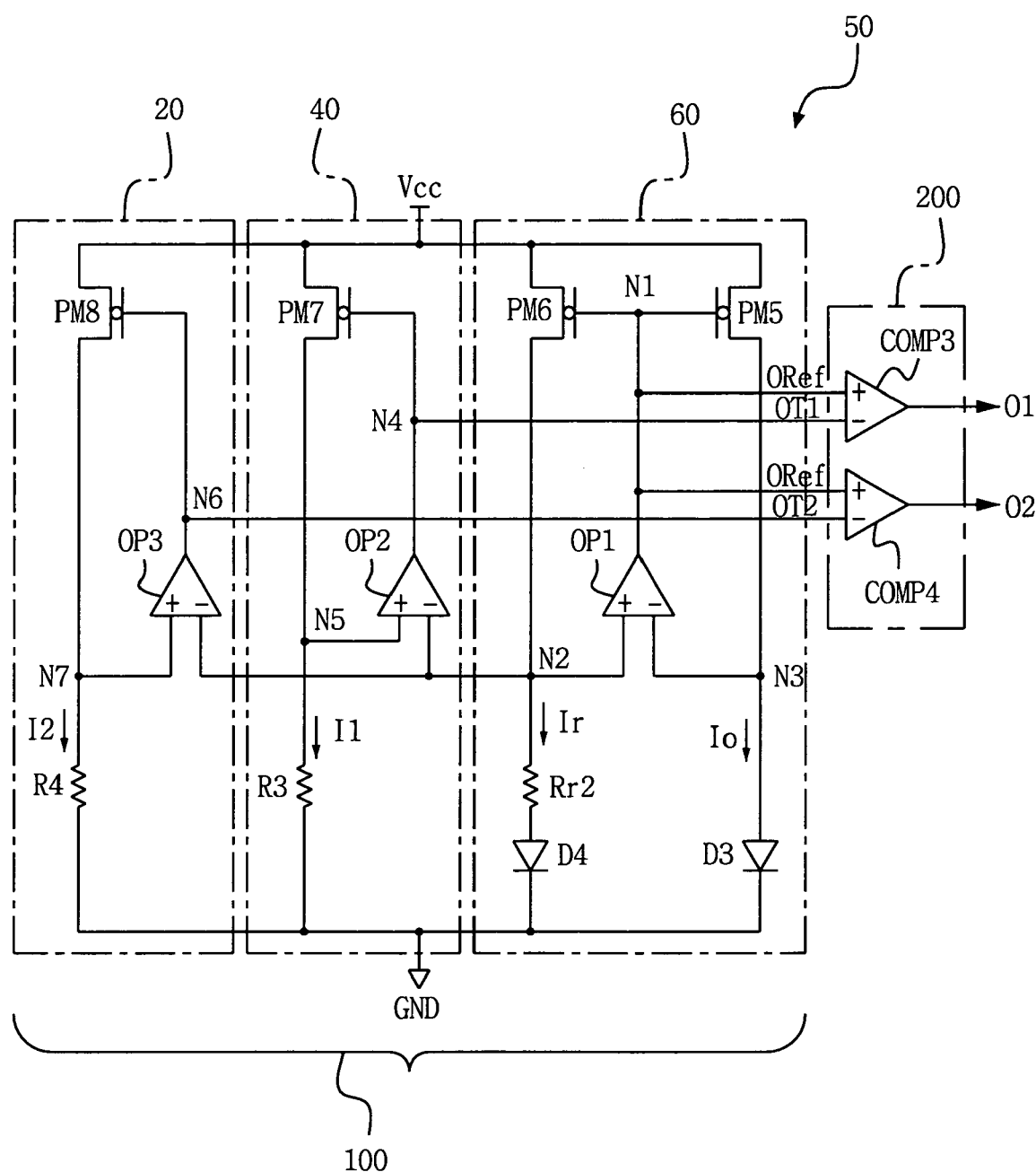

FIGS. 2a and 2b are circuit diagrams each showing exemplary embodiments of the temperature sensing circuit in FIG. 1.

FIG. 2a, illustrates an exemplary circuit configuration of a temperature sensing circuit 50 using a band-gap reference circuit. In FIG. 2a, the temperature sensor 100 may be composed of PMOS transistors PM1 to PM4, NMOS transistors NM1 to NM4, resistors Rr1, R1, and R2, and diodes D1 and D2, which may constitute a current mirror type differential amplifier. The control signal generating section 200 may be composed of first and second comparators COMP1 and COMP2. Flowing through the resistors R1 and R2 in temperature sensor 100 are currents I1 and I2, respectively. The currents I1 and I2 may be reduced with increase in temperature when flowing through the resistors R1 and R2. As such, the respective branches having the resistors R1 and R2 connected thereto may be referred to as reduction resistor branches. Further, a current Ir flowing through the resistor Rr1 may also increase with the increase in the temperature. As such, a branch having the resistor Rr1 connected thereto may be referred to as an increase resistor branch. Diode D1 and diode D2 may be junction diodes having the same size. A size ratio of the PMOS transistors PM1 to PM4 may be set to PM1:PM2:PM3:PM4=M:1:M:M. The size ratio of the PMOS transistors may also be applicable to NMOS transistors NM1 to NM4. For example, the size may be set by a channel length L of the transistor multiplied by a gate width W.

The operation of the temperature sensor 100 as shown in FIG. 2a will be hereinafter described. The current mirror operation by the PMOS transistors MP1 and MP2 and the NMOS transistors MN1 and MN2, which constitute the differential amplifier, may result in current flow of Io:Ir=1:1. Accordingly, this may allow voltages developed at the respective corresponding branches A and B to be at the same level. In a typical junction diode, a current equation in a turn-on period may be as shown below in Equation 1.

$$I=Is\{e^{(VD/VT)}-1\} \approx Is*e^{(VD/VT)}.$$ <Equation 1> where, Is may be a reverse saturation current, VD may be a diode voltage, and VT may be a thermal voltage and have a value of (k*T/q). Further, (*) may be used as a sign representing multiplication.

Because the voltages developed at the branch Io and the branch Ir may be identical to each other, the diode voltage may become VD1=VD2+Ir*Rr1, and the current flow may become Io=Is*$e^{(VD1/VT)}$ ⇒ VD1=VT*In(Io/Is).

Further, because the current may become Ir=Is*$e^{(VD2/VT)}$ ⇒ VD2=VT*In(Ir/Is)=VT*In(M*Io/Is), the diode voltage may become VT*In(Io/Is)=VT*In(M*Io/Is)+Ir*Rr1.

Accordingly, because the current may become Ir=VT*In(M)/Rr1, a current proportional to the temperature may flow through the branch Io. Further, if currents having similar amount may be allowed to flow through I1 and Io, the voltage across the branch I1 may become substantially identical to the voltage across the resistor Rr1, resulting in Ir(Rr1) =VD1=VT*In(Io/Is). Normally, because the reverse saturation current Is may be increased depending on the increase in temperature as compared to the VT, a diode voltage may have a characteristic of being reduced depending on the temperature. Thus, because the voltage across I1 (R1) may be reduced with increase in temperature, the current I1 may be also reduced with the increase in temperature. Likewise, because the I2 (R2) voltage may be also reduced with the increase in temperature, the current I2 may also be reduced with the increase in temperature.

Figure 3:
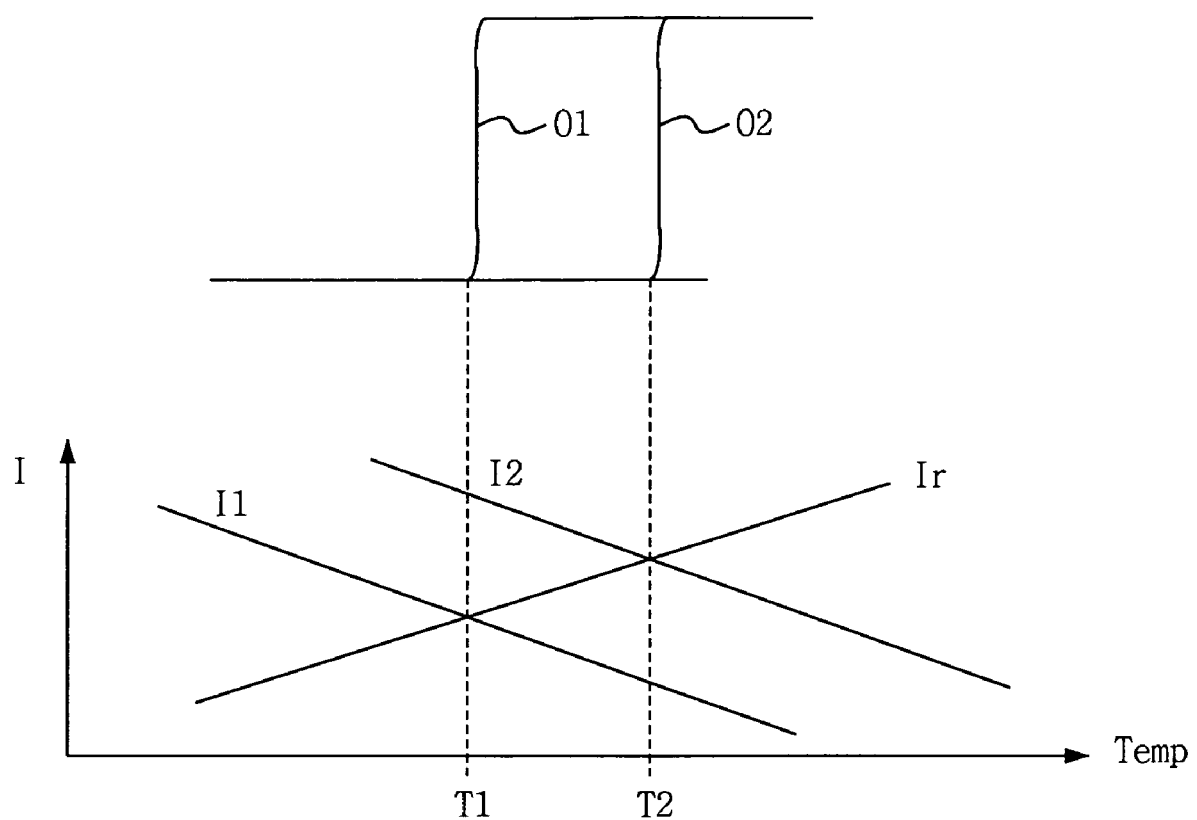
FIG. 3 illustrates a graph showing current change to temperature according to an operation of the temperature sensing circuit of FIGS. 2a and 2b.

Therefore, determining the reference current Ir and the resistance of the reduction resistor (R1 and R2) branches may cause an Ir value and I1 and I2 values to be crossed in the particular temperatures T1 and T2 as shown in FIG. 3. As a result, the temperature sensor 100 of FIG. 2a may function as a temperature sensor designed to have a trip point at the two particular temperatures T1 and T2.

FIG. 3 is a graph of current change versus temperature according to an exemplary operation of the temperature sensing circuit 50 of FIGS. 2a and 2b. In FIG. 3, an abscissa axis denotes temperature and an ordinate axis denotes current. Further, a point where the reference current Ir and the first sensing current I1 cross may be determined by a first set temperature T1, and a point where the reference current Ir and a second sensing current I2 cross may be determined by a second set temperature T2. Accordingly, voltages ORef, OT1 and OT2 (shown in FIGS. 2a and 2b) corresponding to the reference current Ir, the first sensing current I1, and the second sensing current I2, may be correspondingly applied to the input terminals of the first and second comparators COMP1 and COMP2. The first and second comparators COMP1 and COMP2 may compare the voltages to each other and output temperature sensing data O1 and O2, respectively. The data O1 and O2 as digital data may be shown as having voltage waveforms O1 and O2 of FIG. 3. In FIG. 3, if the particular temperature T1 may be, for example, 45° C., then the particular temperature T2 may be, for example, 55° C.

Referring to FIG. 2b, a temperature sensor 100 designed to have a trip point at two particular temperatures T1 and T2, similar to FIG. 2a is shown. The temperature sensor 100 may be composed of a reference voltage generating circuit 60 for generating a reference output voltage ORef, a first temperature sensing section 40 for generating a first sensing output voltage OT1 to detect a first set temperature, and a second temperature sensing section 20 for generating a second sensing output voltage OT2 to detect a second set temperature. The control signal generating section 200 may be composed of first and second comparators COMP3 and COMP4, as in FIG. 2a. The control signal generating section 200 may compare the reference output voltage ORef to the first sensing output voltage OT1, and the reference output voltage ORef to the second sensing output voltage OT2 to output the first and second temperature sensing data O1 and O2.

The reference voltage generating circuit 60 may include a PMOS transistor PM6 having a source terminal that may be connected to a power supply voltage Vcc, a gate terminal that may be connected to a node N1, and a drain terminal that may be connected to a node N2. The reference voltage generating circuit 60 may further include a PMOS transistor PM5 having a source terminal that may be connected to the power supply voltage Vcc, a gate terminal that may be connected to the node N1, and a drain terminal that may be connected to a node N3. The reference voltage generating circuit 60 may further include a reference resistor Rr2 having one end that may be connected to the node N2. The reference voltage generating circuit 60 may further include a diode D4 having an anode that may be connected to the other end of the reference resistor Rr2 and a cathode that may be connected to a ground. The reference voltage generating circuit 60 may further include a diode D3 having an anode that may be connected to the node N3 and a cathode that may be connected to the ground. The reference voltage generating circuit 60 may further include a first operational amplifier OP1 having a first input terminal that may be connected to the node N2, a second input terminal that may be connected to the node N3, and an output terminal that may be connected to the node N1.

The first temperature sensing section 40 may include a PMOS transistor PM7 having a source terminal that may be connected to the power supply voltage Vcc, a gate terminal that may be connected to the node N4, and a drain terminal that may be connected to a node N5. The first temperature sensing section 40 may further include a first sensing resistor R3 having one end that may be connected to the node N5 and the other end that may be connected to the ground. The first temperature sensing section 40 may further include a second operational amplifier OP2 having a first input terminal that may be connected to the node N5, a second input terminal that may be connected to the node N2, and an output terminal that may be connected to the node N4.

The second temperature sensing section 20 may include a PMOS transistor PM8 having a source terminal that may be connected to the power supply voltage Vcc, a gate terminal that may be connected to a node N6, and a drain terminal that may be connected to a node N7. The second temperature sensing section 20 may further include a second sensing resistor R4 having one end that may be connected to the node N7 and the other end that may be connected to the ground. The second temperature sensing section 20 may further include a third operational amplifier OP3 having a first input terminal that may be connected to the node N7, a second input terminal that may be connected to the node N2, and a output terminal that may be connected to the node N6.

The operation of the temperature sensing circuit 50 configured as in FIG. 2b will be hereinafter described. Similar to the case of FIG. 2a, it may be assumed that the diode D3 and the diode D4 may be junction diodes having the same size, and a size ratio of the PMOS transistors PM5, PM6, PM7 and PM8 may be M:1:M:M. Since currents flowing into the input terminals of the first to third operational amplifiers OP1 to OP3 may be negligible, the current flowing into the drain terminal of the PMOS transistor PM5 may be the same as the current flowing along the diode D3, the current flowing into the drain terminal of the PMOS transistor PM6 may be the same as the current flowing along the reference resistor Rr2, the current flowing into the drain terminal of the PMOS transistor PM7 may be the same as the current flowing along the first sensing resistor R3, and the current flowing into the drain terminal of the PMOS transistor PM8 may be the same as the current flowing along the second sensing resistor R4. Because the nodes N2, N3, N5, and N7 may be all connected to the corresponding input terminals of the first to third operational amplifiers OP1 to OP3, each nodes N2, N3, N5, and N7 may have the same potential. Because a size ratio of the PMOS transistors PM5, PM6, PM7 and PM8 may be set to M:1:M:M, a ratio of the currents flowing along the drain terminals of the transistors may also be M:1:M:M.

Thus, if the turn-on condition is met, the current flowing through the junction diode may be determined as shown in Equation 2.

$$I = Is(e^{(VD/VT)} - 1) \approx Is \times e^{(VD/VT)} \qquad \text{<Equation 2>}$$

where, Is may be a reverse saturation current of the junction diode, VD may be a voltage across the diode, and VT may be a thermal voltage and has a value of (k×T)/q.

Because the voltages VN2 and VN3 at the nodes N2 and N3 of FIG. 2b may have identical values, they may be expressed as in Equation 3.

$$V(N2) = V(N3) = VD3 = VD4 + Ir \times Rr2 \qquad \text{<Equation 3>}$$

where, VD3 may be a voltage across the diode D3 and VD may be a voltage across the diode D4. Further, because the voltages VN2 and VN3 may be identical, the current flow at branch Io may become Io=Is*e(VD3/VT), and the diode voltage across diode D3 and VD may become VD3=VT*In(Io/Is). Further, the current flow at branch Ir may become Ir=Is*e(VD4/VT), and the voltage diode across diode D4 and VD may become VD4=VT*In(Ir/Is)=VT*In((Io/M)/Is). In Equation 3, because VD3=VD4+Ir*Rr2, the current Ir may be expressed by the following equation.

$$Ir = (VT \times In(M))/Rr2 \qquad \text{<Equation 4>}$$

Accordingly, a current proportional to temperature may flow through the resistor Rr2. As described above, because the nodes N2, N3, N5, and N7 may all, be connected to the input terminals of the operational amplifier, a potential V(N5) at the node N5 and a potential V(N7) at the node N7 may be substantially the same as V(N3). The V(N3) may be the same as a voltage across the diode D3, and may have a value of VT×In(Io/Is). Generally, as the temperature may be increased, the VT may be increased but the Is may be increased in a much larger proportion, and thus the voltage across the diode may be reduced with the increase in temperature. As the temperature may be increased, the V(N5) and V(N7) may be reduced, and thus the first sensing current I1 flowing through the first sensing resistor R3 and the second sensing current I2 flowing through the second sensing resistor R4 may have both a characteristic of being reduced with the increase of temperature.

The reference current Ir flowing through reference resistor Rr2 may be increased as the temperature is increased, and the current I1 flowing through the first sensing resistor R3 and the current I2 flowing through the second sensing resistor R4 may be both reduced with the increase in temperature. Therefore, determining the reference current Ir and tuning the resistance of the reduction resistor (R3 and R4) branches allow the Ir value and I1 and I2 values to cross at the particular temperatures T1 and T2 as shown in FIG. 3.

The voltages ORef, OT1 and OT2, each corresponding to the reference current Ir, the first sensing current I1, and the second sensing current I2, respectively, may be correspondingly applied to the input terminals of the first and second comparators COMP3 and COMP4. The first and second comparators COMP3 and COMP4 may compare the voltages to each other and output the temperature sensing data O1 and O2, respectively.

A minimum power supply voltage for operating the temperature sensing circuit 50 as shown in FIG. 2b may be set to a value obtained by summing the voltage VD3 across the diode D3 and the saturation voltage Vds, sat between the drain and the source of the PMOS transistor PM5. The value may be about 1.1V. Therefore, it may be that the circuit of FIG. 2b may be operated at a lower power supply voltage.

Thus, one of two temperature sensing circuits as described above may be selectively employed depending on the level of the operation power supply voltage used for the semiconductor memory device.

Hereinafter, description will be given on how the output characteristics of the internal circuits may be adjusted by the temperature sensing data outputted from the above-stated temperature sensing circuit.

Figure 4:
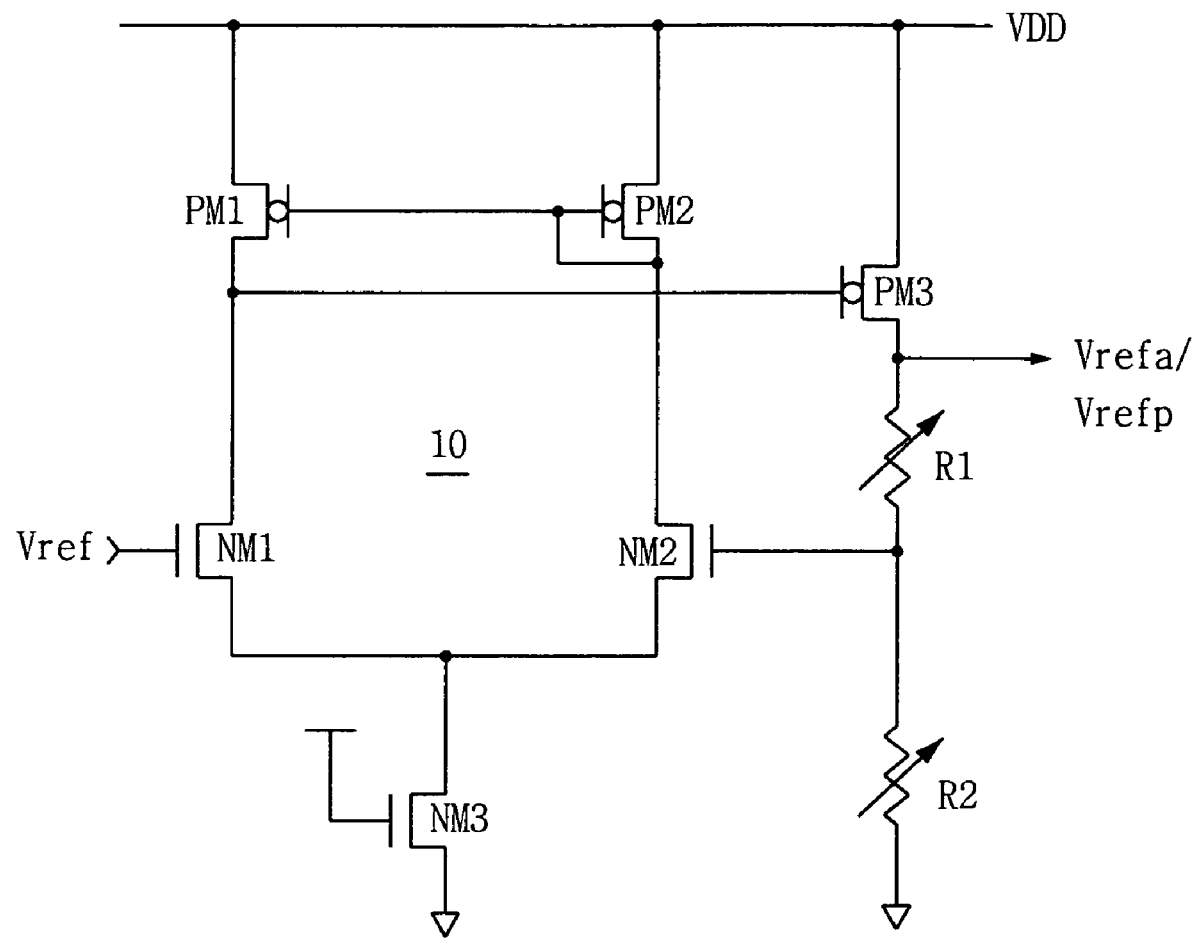
FIGS. 4 to 6 illustrate exemplary embodiments of the DC generator in FIG. 1.
Figure 5:
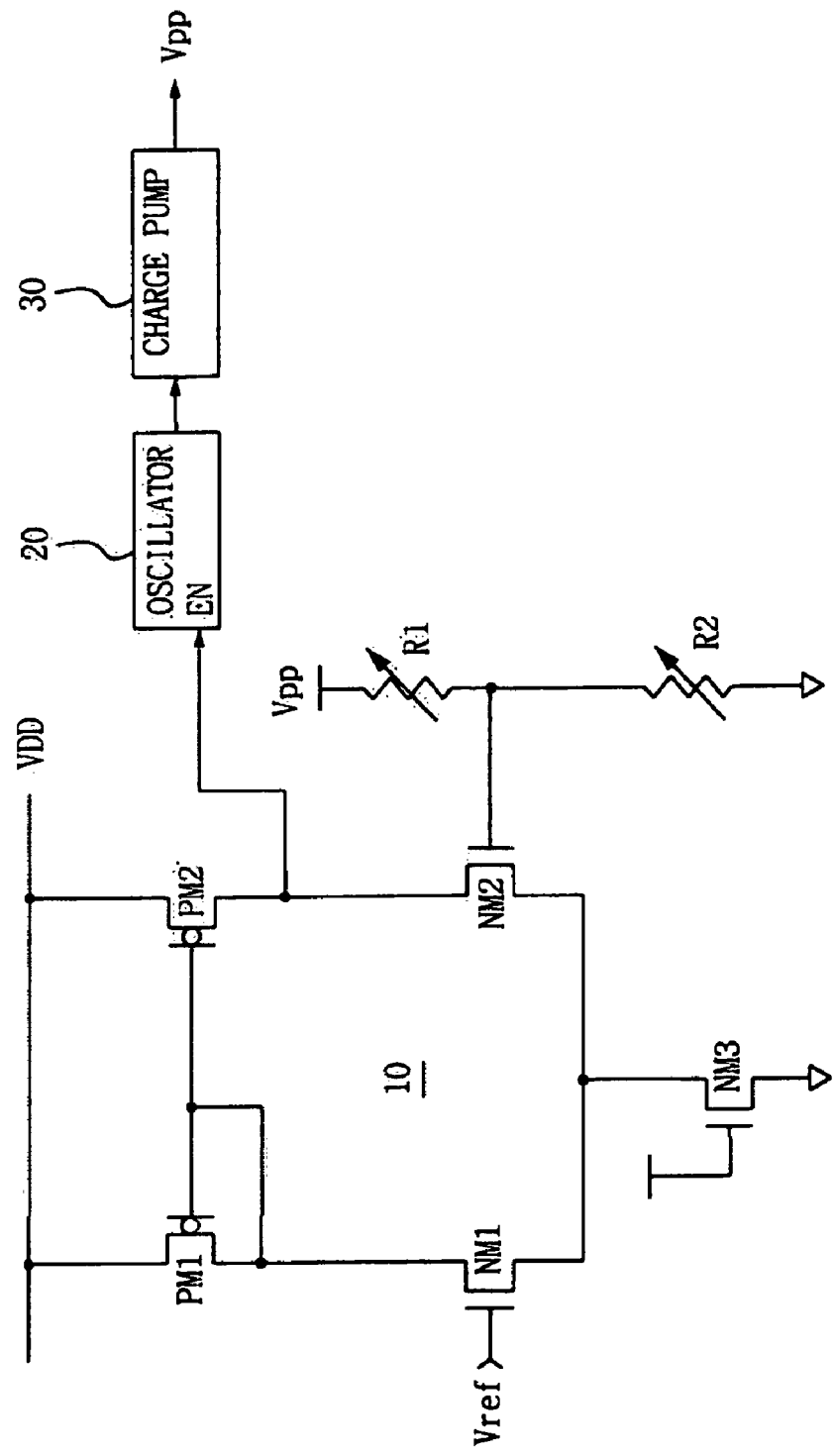
Figure 6:
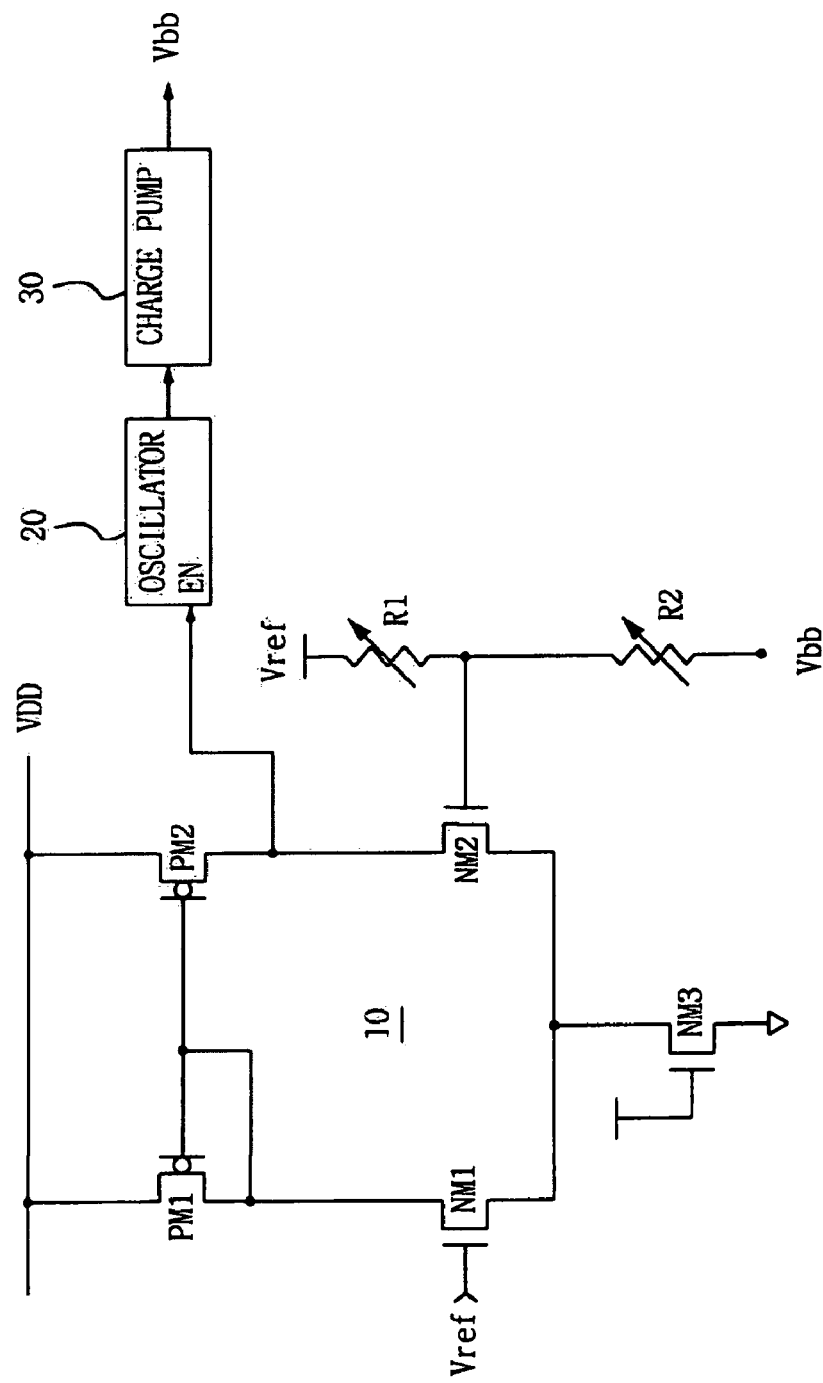

FIGS. 4 to 6 are internal circuit diagrams each showing exemplary embodiments of the DC generator 300 shown in FIG. 1. FIG. 4 illustrates a circuit of a reference voltage generator for generating a reference voltage Vrefa for a memory cell array of the semiconductor memory device or a reference voltage Vrefp for a peripheral circuit. FIG. 5 illustrates a circuit of a high voltage generator for generating a high voltage Vpp of the semiconductor memory device and the like. Further, FIG. 6 illustrates a substrate bias voltage generating circuit for generating a negative voltage Vbb (or a substrate bias voltage), which may be applied to a substrate or a bulk of the semiconductor memory device.

First, the reference voltage generating circuit of FIG. 4 may be composed of a current mirror type differential amplifier 10 composed of PMOS transistors PM1 and PM2 and NMOS transistors NM1 to NM3, a driving PMOS transistor PM3, and first and second variable resistors R1 and R2. The reference voltage generating circuit, which may be well known in the art, may have substantially the same circuit configuration except for the first and second variable resistors R1 and R2 as shown in FIG. 4.

Accordingly, the temperature sensing data that may be outputted from the temperature sensing circuit 50 as in FIG. 2a or 2b may change the resistance of the first and second variable resistors R1 and R2 in the reference voltage generating circuit depending on the temperature change, and thereby may adjust the reference voltage output characteristic. More specifically, increasing the reference voltages Vrefa and Vrefp may be accomplished by allowing the first variable resistor R1 to have a higher resistance or the second variable resistor R2 to have a lower resistance, while reducing the reference voltages Vrefa and Vrefp that may be accomplished by allowing the first variable resistor R1 to have a lower resistance or the second variable resistor R2 to have a higher resistance.

Figure 11:
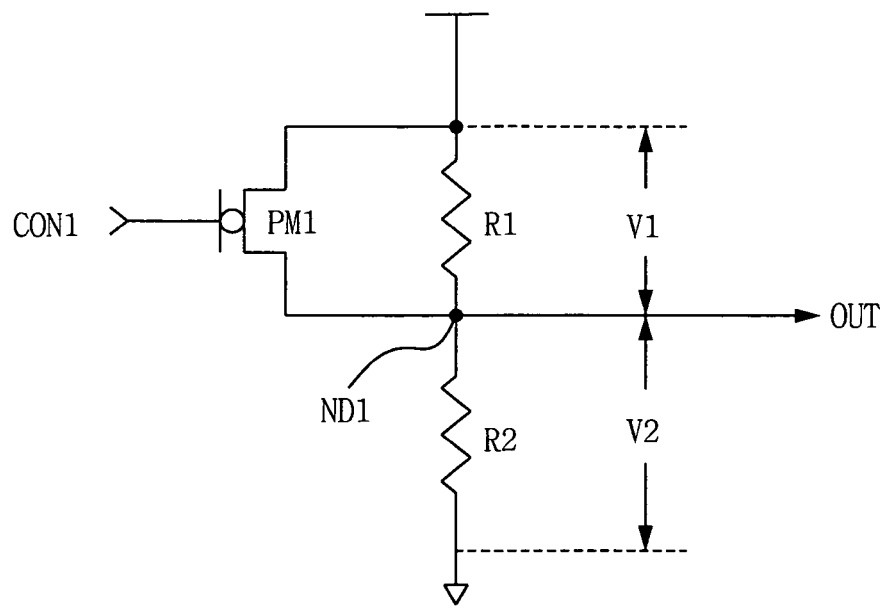
FIGS. 11 and 12 illustrate a resistance change principle of variable resistors that may be employed in the exemplary internal circuits.
Figure 12:
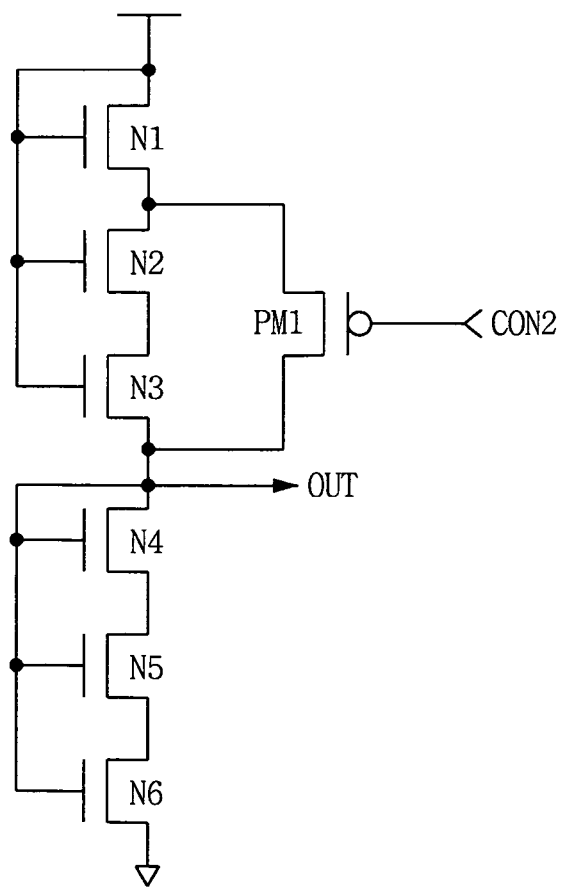

Accordingly, changing the resistance of the first and second variable resistors R1 and R2 depending on the temperature sensing data may be shown in FIGS. 11 and 12. FIGS. 11 and 12 illustrate a resistance change principle of variable resistors that may be employed in internal circuits in accordance with exemplary embodiments of the present invention. First, referring to FIG. 11, there may be shown a configuration in which a PMOS transistor PM1 and first and second resistors R1 and R2 may be connected. If the temperature sensing data may be applied to the gate terminal of the PMOS transistor PM1 as a control signal CON1, a voltage OUT at a node ND1 may become higher or lower depending on a turn-on or turn-off operation of the PMOS transistor PM1. For example, if the PMOS transistor PM1 may be turned off, the resistance of the first resistor R1 may be present between the power supply voltage and the node ND1. If the PMOS transistor PM1 may be turned on, the summed parallel resistance obtained by summing the resistance of the first resistor R1 and the turned on resistance of the PMOS transistor PM1 may be present between the power supply voltage and the node ND1. The summed parallel resistance may be reduced than that of the first resistor R1. In that case, there may be substantially no current flowing through the first resistor R1, thus reducing the voltage V1. As a result, in FIG. 11, since the voltage V2 may be equal to V1*[R2/(R1+R2)], the voltage OUT at the node ND1 may be raised if the PMOS transistor PM1 may be turned on.

Referring to FIG. 12, illustrates a serial resistance-controlling configuration which may be composed of NMOS transistors N1 to N6. As shown in FIG. 12, since the summed serial resistance by the NMOS transistors N2 and N3 may be negligible when the. PMOS transistor PM1 may be turned on by the control signal CON2, the outputted voltage OUT may be raised as compared to the case where the PMOS transistor PM1 may be turned off.

As described above, the output characteristic may be adjusted depending on the temperature sensing data by configuring the variable resistor element in the configuration as in FIGS. 11 and 12. It is possible to adjust the level of the output voltage OUT by further disposing a control transistor in parallel with the second resistor R2 between the node ND1 and the ground terminal of FIG. 11.

Returning to FIG. 4, the reference voltage output characteristic may be adjusted by changing the resistance of the first and second variable resistors R1 and R2 in the reference voltage generating circuit. The reference voltage output characteristic of FIG. 4 may have the similar adjusted resistance of the first and second variable resistors of FIGS. 11 and 12. In a case where it may be required to compensate the level of the reference voltages Vrefa and Vrefp that may be reduced with increase in temperature, the resistance of the first variable resistor R1 may be a higher resistance or the second variable resistor R2 may be a reduced resistance by placing the control transistors at the turned off state. However, in a case where it may be required to compensate the level of the reference voltages Vrefa and Vrefp that may be raised as the temperature may be reduced, the resistance of the first variable resistor R1 may be a reduced resistance or the second variable resistor R2 may be a higher resistance. When temperature is reduced, the power consumption may be reduced as well, thus obtaining a power-saving semiconductor memory device.

Referring to FIG. 5, there may be shown a circuit configuration of a high voltage generator for generating a high voltage pp in accordance with an exemplary embodiment. The high voltage generator of FIG. 5 may be composed of a current mirror type differential amplifier 10. The current mirror type differential amplifier 10 may be composed of PMOS transistors PM1 and PM2 and NMOS transistors NM1 to NM3, an oscillator 20, a charge pump 30, and first and second variable resistors R1 and R2. The circuit configuration of the high voltage generator, which may be well known in the art, may have substantially the same circuit configuration except for the first and second variable resistors R1 and R2 as shown in FIG. 5.

The temperature sensing data that may be outputted from the temperature sensing circuit 50 as in FIG. 2a or 2b may change the resistance of the first and second variable resistors R1 and R2 in the high voltage generating circuit depending on the temperature change, thereby may adjust a high voltage output characteristic. Similar to the case of FIG. 4, increasing the high voltage Vpp may be accomplished by causing the resistance of the first variable resistor R1 to be raised or the resistance of the second variable resistor R2 to be reduced, while reducing the high voltage Vpp may be accomplished by causing the resistance of the first variable resistor R1 to be reduced or the resistance of the second variable resistor R2 to be raised. Changing the resistance of the first and second variable resistors R1 and R2 depending on the temperature sensing data may be equally implemented in the same manner as in FIGS. 11 and 12. Accordingly, even in case of FIG. 5, a high voltage output characteristic may be adjusted depending on the temperature sensing data, and power consumption may be reduced in a reduced temperature area.

Referring to FIG. 6, there may be shown a circuit configuration of a substrate bias voltage generator for generating a negative voltage Vbb in accordance with an exemplary embodiment. The substrate bias voltage generator of FIG. 6 may be composed of a current mirror type differential amplifier 10. The current mirror type differential amplifier 10 may be composed of PMOS transistors PM1-PM2 and NMOS transistors NM1-NM3, an oscillator 20, a charge pump 30, and first and second variable resistors R1 and R2. A circuit configuration of the substrate bias voltage generator, which may be well known in the art, may have substantially the same circuit configuration except for the first and second variable resistors R1 and R2 as shown in FIG. 6.

The temperature sensing data outputted from the temperature sensing circuit 50 as in FIG. 2a or 2b may change the resistance of the first and second variable resistors R1 and R2 in the substrate bias voltage generator depending on the change in temperature, thus may adjust an output characteristic of a negative voltage. Similar to the case of FIG. 5, increasing the substrate bias voltage Vbb may be accomplished by allowing the first variable resistor R1 to have a reduced resistance or the second variable resistor R2 to have an increased resistance, while reducing the negative voltage may be accomplished by allowing the first variable resistor R1 to have an increased resistance or the second variable resistor R2 to have a reduced resistance. Changing the resistance of the first and second variable resistors R1 and R2 depending on the temperature sensing data may be implemented in the same manner as in FIGS. 11 and 12. Accordingly, even in case of FIG. 6, the output characteristic of the substrate bias voltage may be adjusted depending on the temperature sensing data, and power consumption may be reduced by causing the charge pump 30 to have a lower clock frequency for the pumping operation in the reduced temperature area than that in the raised temperature area.

Figure 7:
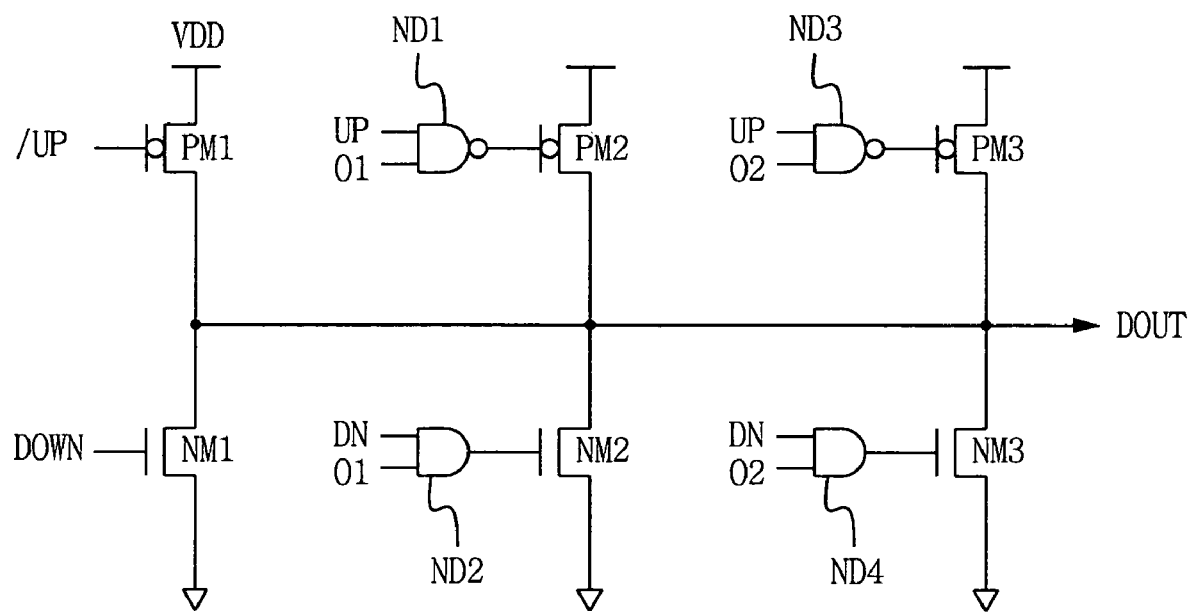
FIG. 7 illustrates an exemplary embodiment of the output driver in FIG. 1.

FIG. 7 is an internal circuit diagram showing an exemplary embodiment of the output driver 400 in FIG. 1. FIG. 7 illustrates a configuration in which pull-up PMOS transistors PM1 to PM3, pull-down NMOS transistors NM1 to NM3, first and second NAND gates ND1 and ND3, and first and second AND gates ND2 and ND4 may be connected.

A pull-up control signal UP may be applied to one input UP of the first and second NAND gates ND1 and ND3 of FIG. 7, and temperature sensing data outputted from temperature sensing circuit 50 as in FIG. 2a or 2b may be applied to the other inputs O1 and O2 as the control signal O1 and O2. A pull-down control signal DN may be applied to one input DN of the first and second AND gates ND1 and ND3, and the temperature sensing data outputted from the temperature sensing circuit 50 as in FIG. 2a or 2b may be inputted to the other inputs O1 and O2 as control signals O1 and O2. For example, if the pull-up control signal UP, the pull-down control signal DN, and the temperature sensing data O1 may all be applied as logic high (H), the intensity of the output DOUT may become stronger as because he pull-up PMOS transistors PM1 and PM2 and the pull-down NMOS transistors NM1 and NM2 may take part in an output driving operation. Further, if the temperature sensing data O2 may be additionally applied as logic high (H), the intensity of the output DOUT may become stronger because the unit drivers of FIG. 7 may all be driven. Accordingly, in the exemplary embodiment of FIG. 7, the data output characteristic of the output driver may be adjusted depending on temperature sensing data, and the power consumption in a reduced temperature area may be reduced by reducing the number of driving unit.

Figure 8:
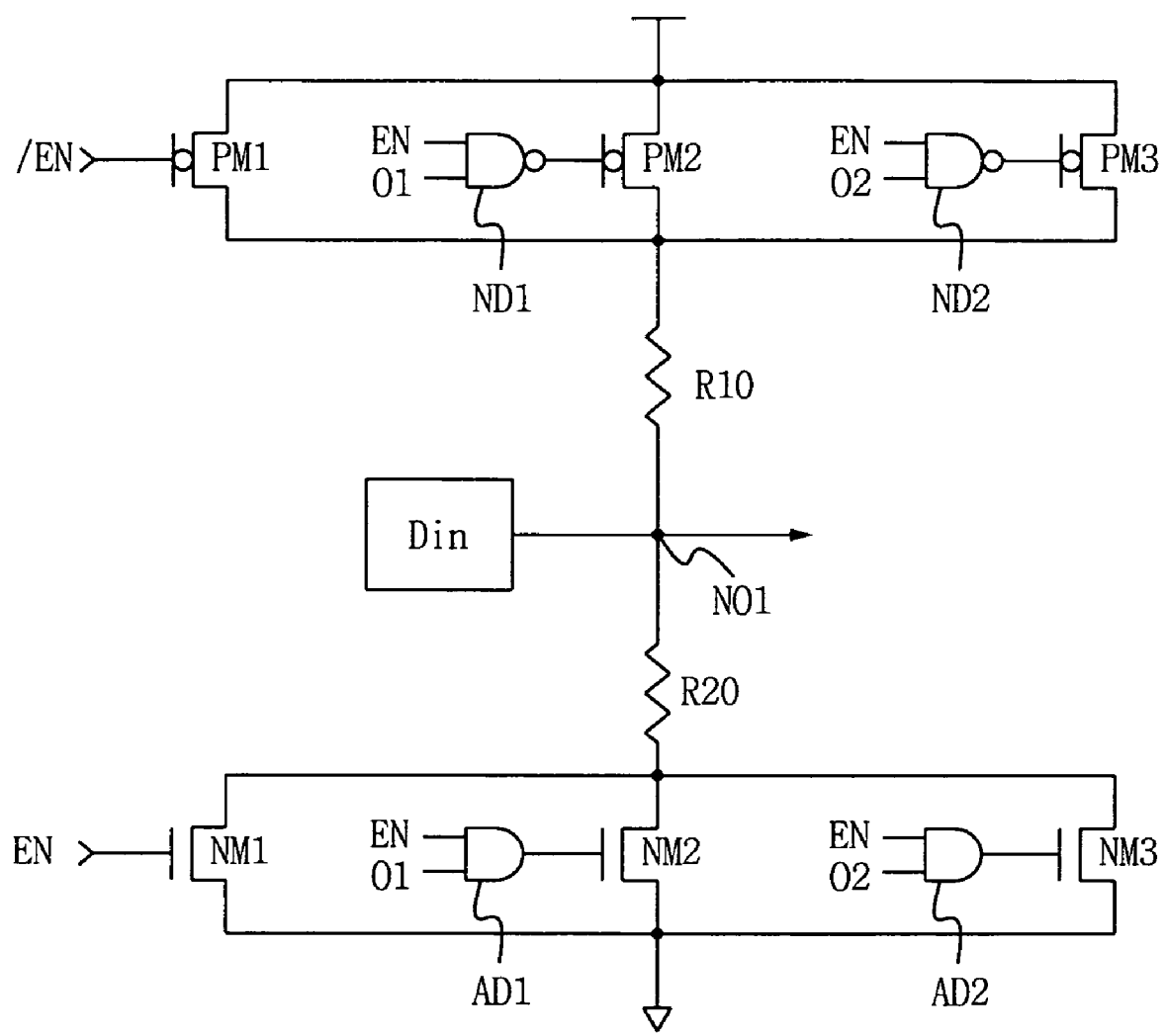
FIG. 8 illustrates an exemplary embodiment of the termination circuit in FIG. 1.

FIG. 8 is an internal circuit diagram showing an exemplary embodiment of the termination circuit 500 in FIG. 1. FIG. 8 illustrates a configuration in which PMOS transistors PM1 to PM3, NMOS transistors NM1 to NM3, first and second NAND gates ND1 and ND2, first and second AND gates AD1 and AD2, and resistors R10 and R20 may be connected. Adjusting the on-die termination for a signal Din applied to the node NO1 to make impedance match may be performed depending on the change in temperature. For example, if an enable control signal EN and the temperature sensing data O1 and O2 may all be applied as logic high (H), the pull-up PMOS transistors PM1-PM3 and the pull-down NMOS transistors NM1 to NM3 may all be turned on. On the other hand, if temperature sensing data O1 may be applied as logic high (H) due to the reduced temperature, the pull-up PMOS transistors PM1 and PM2 and the pull-down NMOS transistors NM1 and NM2 may be turned on. As a result, the change in termination resistance may be made depending on the raised or reduced temperature.

Figure 9:
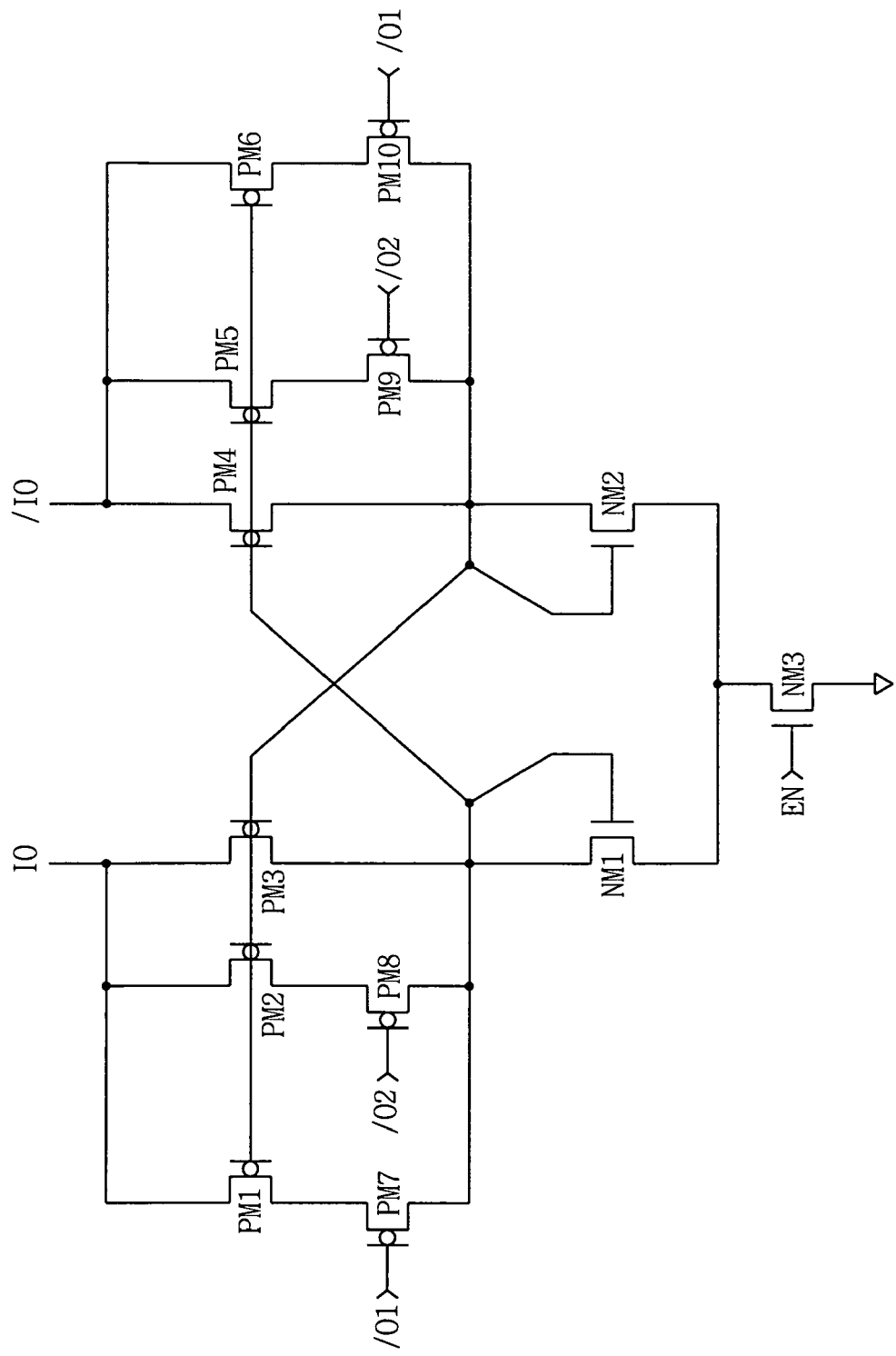
FIG. 9 illustrates an exemplary embodiment of the sense amplifier in FIG. 1.

FIG. 9 is an internal circuit diagram showing an exemplary embodiment of the sense amplifier 600 in FIG. 1. FIG. 9 illustrates a configuration of a typical sense amplifier disposed in the input/output (I/O) lines. If a sensing enable signal EN is applied as logic high (H) and the temperature sensing data /O1 and /O2 obtained by inverting the temperature sensing data O1 and O2 may all be applied as logic low (L), the PMOS transistors PM7-PM10 may be turned on, thus increasing the intensity of the sensing output of the sense amplifier. On the other hand, if the temperature sensing data /O1 and /O2 are all applied as logic high (L) due to the reduced temperature, the PMOS transistors PM7 to PM10 may be turned off, which reduces the intensity of the sensing output from the sense amplifier.

Figure 10:
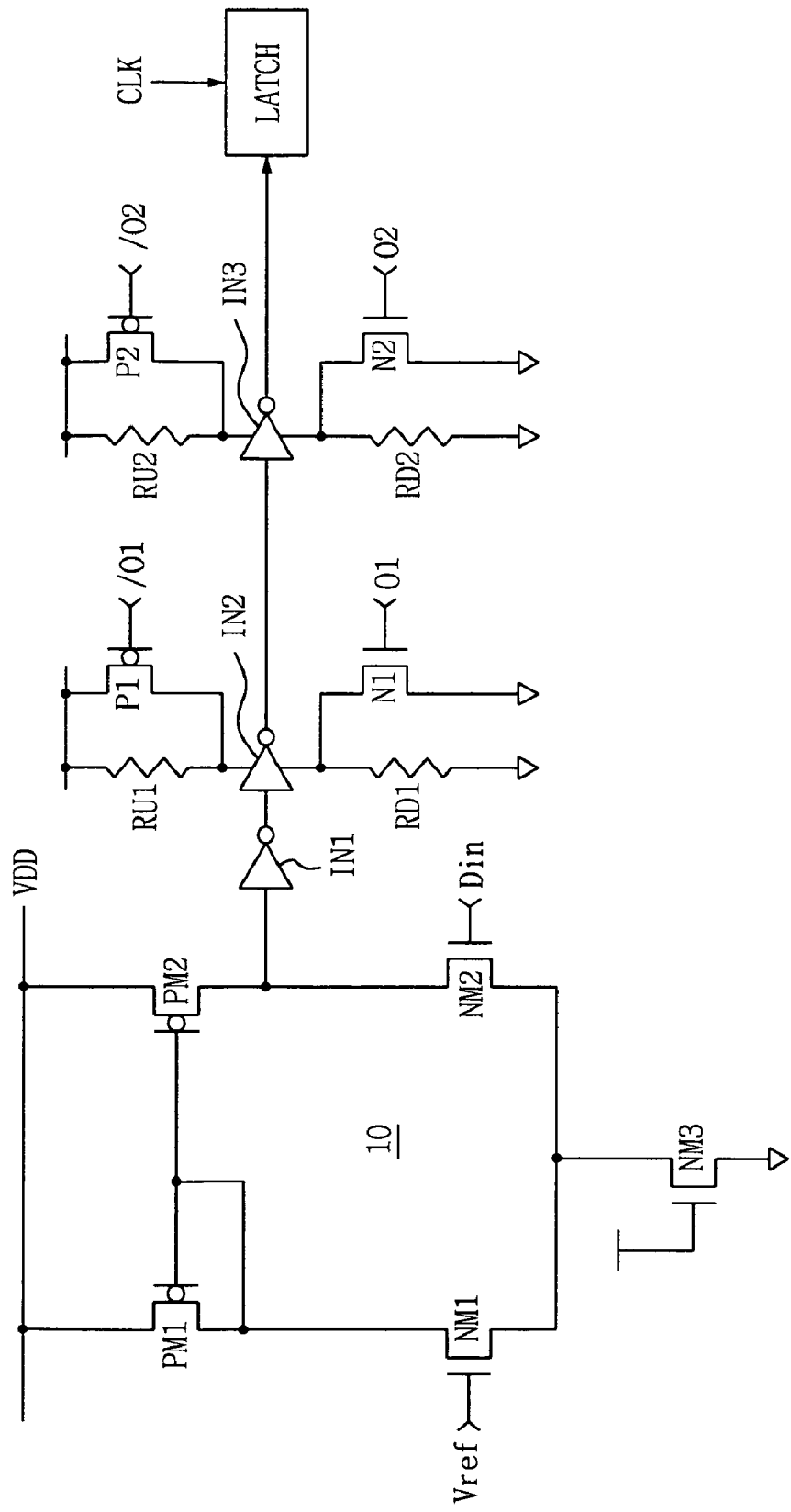
FIG. 10 illustrates an exemplary embodiment of the input buffer in FIG. 1.

FIG. 10 is an internal circuit diagram showing an exemplary embodiment of the input buffer 700 in FIG. 1. The temperature sensing data O1 and O2 and temperature sensing data /O1 and /O2 obtained by inverting the temperature sensing data O1 and O2 may be applied to the gates of the NMOS transistors N1 and N2 and the PMOS transistors P1 and P2, respectively. In the case where the NMOS transistors N1 and N2 and the PMOS transistors P1 and P2 may all be turned on, the corresponding resistors RU1, RU2, RD1 and RD2 may become operable in a disconnecting state (e.g., not taking part in a delay operation). If the NMOS transistors N1 and N2 and the PMOS transistors P1 and P2 may all be turned off, the resistors RU1, RU2, RD1 and RD2 may become operable in a connecting state (e.g., taking part in the delay operation). Thus, the setup and hold times of the data input buffer may be adjusted depending on the temperature sensing data.

Figure 13:
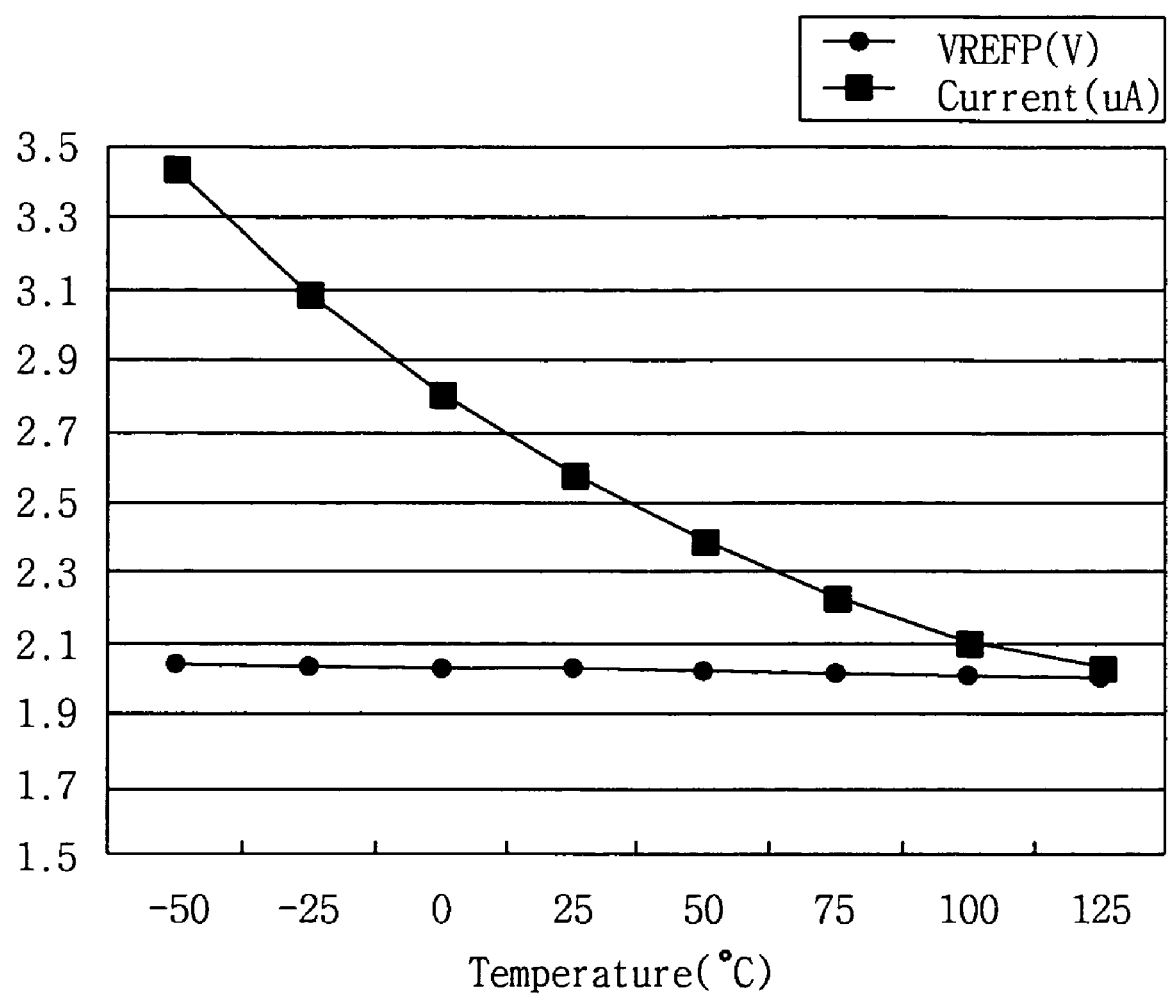
FIGS. 13 and 14 illustrate a difference between current consumption amounts as a function of temperature according to the conventional art and an exemplary embodiment of the present invention.
Figure 14:
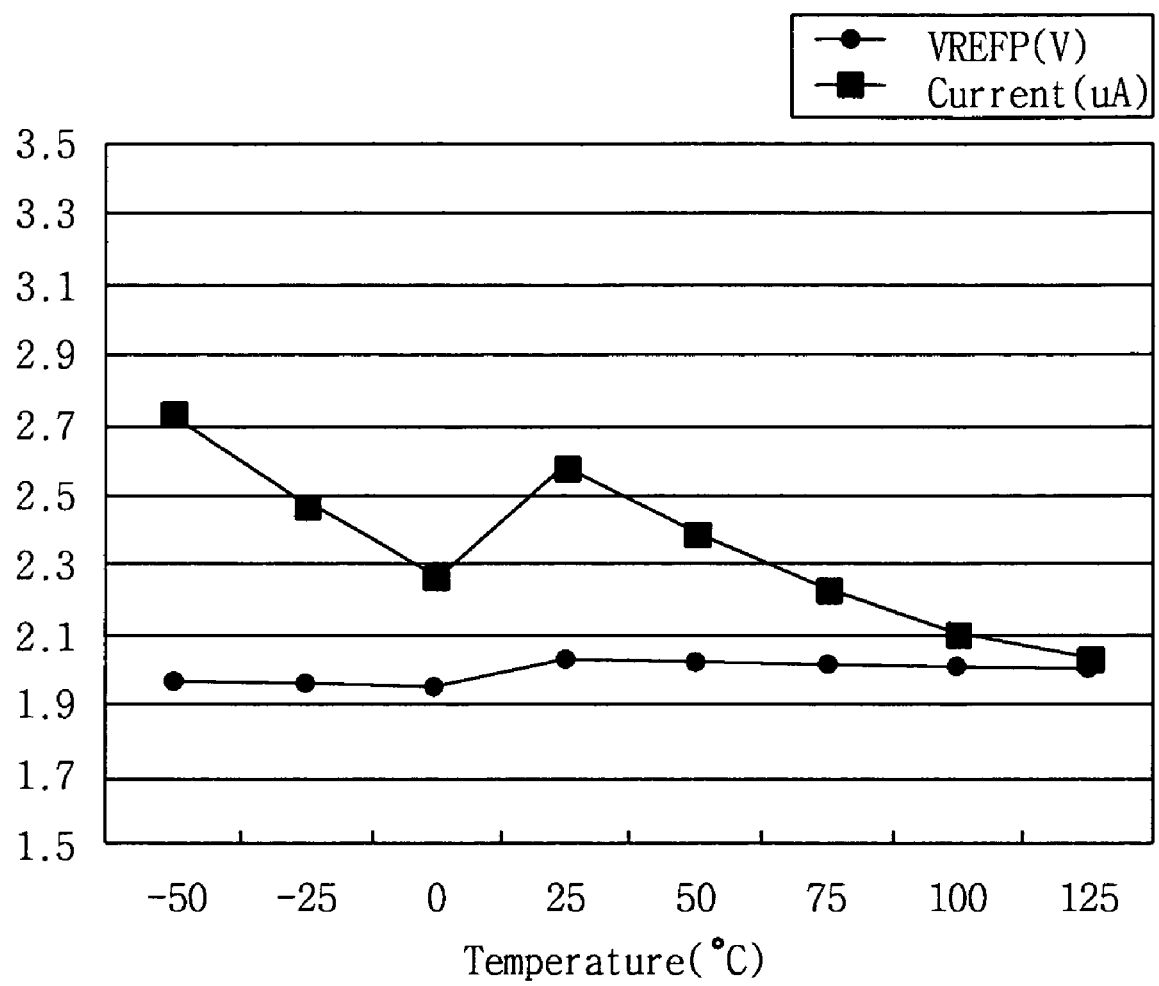

FIGS. 13 and 14 illustrate a difference between current consumption amounts (ordinate axis) as a function of temperature (abscissa axis) according to the conventional art and an exemplary embodiment of the present invention. FIG. 13 illustrates a case of a conventional reference voltage generator and FIG. 14 illustrates a case of the reference voltage generator as shown in FIG. 4. Because the current graph of FIG. 14 may illustrate a reduced amount of current as compared with the current graph of FIG. 13, the consumption amount of the current may be reduced in the case of the present invention that controls the output characteristic depending on the temperature sensing data.

As described above, dividing the temperature and adjusting an output characteristic depending on temperature sensing data may compensate the output characteristic depending on the temperature, thereby enhancing stability of the operation and reducing power consumption.

Although the above exemplary embodiments described the semiconductor memory device as a dynamic random access memory (DRAM), it should be appreciated by one of ordinary skill in the art that other memory devices such as, for example, a static RAM, a floppy disk and disk drive, a writable optical disk and disk drive, a hard drive, flash memory or the like may be implemented.

As described above, the semiconductor memory device according to exemplary embodiments may have an advantage that the output characteristic of the internal circuits depending on temperature change may be compensated, thereby enhancing stability of the operation and reducing power consumption.

Although the embodiments of the present invention have been primarily described by way of example with reference to the accompanying drawings, it will be apparent to those skilled in the art that various variations and modifications may be made to the present invention without departing from the technical spirit of the present invention. For example, there may be no doubt that various modifications may be made to the number of temperature sensing data or the method of allowing the temperature sensing data to be applied to the internal circuits, if necessary.

What is claimed is:

1. A semiconductor memory device, comprising:
   a temperature sensing circuit that generates and outputs temperature data as a control signal in response to ambient temperature of the semiconductor memory device; and
   an internal circuit having a voltage output level, the voltage output level of the internal circuit being decreased in response to the control signal from the temperature sensing circuit representing a decrease in the ambient temperature,
   wherein the temperature sensing circuit is a current mirror type differential amplifier connected to a reduction resistor branch for which a current is reduced with an increase in temperature, and
   wherein the voltage output level is based on changed resistances of at least two resistors in the internal circuit and the internal circuit includes a high voltage generating circuit for generating a high voltage having a level higher than that of an internal power supply voltage of the semiconductor memory device.

2. The device according to claim 1, wherein the temperature sensing circuit includes a band-gap reference circuit.

3. The device according to claim 1, wherein the internal circuit includes a reference voltage generating circuit.

4. The device according to claim 3, wherein the temperature sensing data is applied to a gate terminal of a transistor that variably changes output resistance of the internal circuit.

5. The device according to claim 1, wherein the internal circuit includes a substrate voltage generating circuit for generating a negative voltage having a negative voltage level with respect to a level of an internal power supply voltage of the semiconductor memory device.

6. The device according to claim 1, wherein the internal circuit includes a data output driver of the semiconductor memory device.

7. The device according to claim 1, wherein the internal circuit includes an on-die termination circuit of the semiconductor memory device.

8. The device according to claim 1, wherein the internal circuit includes an input/output sense amplifier circuit connected to input/output lines of the semiconductor memory device.

9. The device according to claim 1, wherein the internal circuit includes an input buffer for buffering various input signals applied to the semiconductor memory device.

10. The device according to claim 1, wherein the temperature sensing data is applied to a gate terminal of a transistor that variably changes output resistance of the internal circuit.

11. The device according to claim 1, wherein the temperature sensing circuit further comprises a temperature sensor and a control signal generating unit, the temperature sensor including:

a reference voltage generating circuit for generating a reference output voltage;

a first temperature sensing section for generating a first sensing output voltage to detect a first set temperature;

a second temperature sensing section for generating a second sensing output voltage to detect a second set temperature; and the control signal generating unit including first and second comparators for comparing the reference output voltage and the first and second sensing output voltages, respectively, so as to produce first and second temperature sensing data.

12. A semiconductor memory device, comprising:

a temperature sensor for detecting ambient temperature of the semiconductor memory device as an output signal;

a control signal generating unit for comparing the output signal outputted from the temperature sensor to a reference signal to generate temperature data; and an internal circuit, including a DC generator having a voltage output level, the voltage output level adjusted in response to the temperature data from the control signal generating unit, wherein the voltage output level is based on changed resistances of at least two resistors of a reduction resistor branch of a current mirror type differential amplifier of the DC generator and the internal circuit includes a circuit for generating a voltage having a level higher than that of an internal power supply voltage of the semiconductor memory device.

13. The device according to claim 12, wherein the voltage output level is generated by a reference voltage generating circuit.

14. The device according to claim 13, wherein the reference voltage generating circuit generates a voltage having a negative voltage level with respect to a level of an internal power supply voltage of the semiconductor memory device.

15. The device according to claim 12, wherein the internal circuit has a driving output level that adjusts in response to the temperature data from the control signal generating unit.

16. The device according to claim 15, wherein the driving output level is produced by a data output driver.

17. The device according to claim 12, wherein the internal circuit has a termination resistance that adjusts in response to the temperature data from the control signal generating unit.

18. The device according to claim 17, wherein the termination resistance is produced by an on-die termination circuit.

19. The device according to claim 12, wherein the internal circuit has a sensing output level that adjusts in response to the temperature data from the control signal generating unit.

20. The device according to claim 19, wherein the sensing output level is produced by a sense amplifier circuit connected to input/output lines of the semiconductor memory device.

21. The device according to claim 12, wherein the internal circuit has setup and hold times that adjust in response to the temperature data from the control signal generating unit.

22. The device according to claim 21, wherein the internal circuit includes an input buffer having setup and hold times to buffer various input signals applied to the semiconductor memory device.

* * * * *